(12) United States Patent
Murakami et al.

(10) Patent No.: US 7,218,152 B2
(45) Date of Patent: May 15, 2007

(54) SYSTEM AND METHOD FOR REDUCING POWER CONSUMPTION ASSOCIATED WITH THE CAPACITANCE OF INACTIVE PORTIONS OF A MULTIPLEXER

(75) Inventors: Hiroaki Murakami, Hiratsuka (JP); Osamu Takahashi, Round Rock, TX (US); Shoji Onishi, Gamo (JP)

(73) Assignees: Kabushiki Kaisha Toshiba, Tokyo (JP); International Business Machines Corporation, Armonk, NY (US)

( * ) Notice: Subject to any disclaimer, the term of this patent is extended or adjusted under 35 U.S.C. 154(b) by 144 days.

(21) Appl. No.: 11/033,612

(22) Filed: Jan. 12, 2005

(65) Prior Publication Data

US 2006/0152247 A1    Jul. 13, 2006

(51) Int. Cl.
   *H03K 19/20* (2006.01)
(52) U.S. Cl. .............................. 326/113; 326/37; 326/41
(58) Field of Classification Search ................. 326/37, 326/41, 105, 113; 327/407–410
   See application file for complete search history.

(56) References Cited

U.S. PATENT DOCUMENTS

RE36,839 E    8/2000 Simmons et al.
7,075,332 B1 *   7/2006 Young et al. ................ 326/38

FOREIGN PATENT DOCUMENTS

| JP | 06-140853 | 5/1994 |
| JP | 10-340127 | 12/1998 |
| JP | 2000-293504 A | 10/2000 |
| JP | 2003-67078 A | 3/2003 |

* cited by examiner

*Primary Examiner*—Anh Q. Tran
(74) *Attorney, Agent, or Firm*—Law Offices of Mark L. Berrier

(57) ABSTRACT

Systems and methods for reducing the power consumption associated with the capacitance of sections of a multiplexer are disclosed. At each cycle, a timing signal is selectively sent only to sections of the multiplexer that include active logic. A plurality of control signals is received for processing by a corresponding plurality of input selection circuits. A plurality of additional inputs corresponding to the plurality of input selection circuits may also be received. In one embodiment, each input selection circuit is configured to output a corresponding input signal if a corresponding control signal is asserted and a timing signal is made available to the input selection circuit. To avoid unnecessary power consumption associated with the capacitance of various portions of the multiplexer, the timing signal is only asserted to a portion of the multiplexer at any given clock cycle according to the values of the control signals.

18 Claims, 6 Drawing Sheets

SYSTEM AND METHOD FOR REDUCING POWER CONSUMPTION ASSOCIATED WITH THE CAPACITANCE OF INACTIVE PORTIONS OF A MULTIPLEXER

BACKGROUND OF THE INVENTION

1. Field of the Invention

The invention relates generally to systems and methods for reducing the power consumption of logic circuits. More particularly, the invention relates to systems and methods for selectively sending a clock signal to active sections of a circuit thereby reducing power consumption associated with the inactive sections.

2. Related Art

Typical multiplexers are configured to receive a plurality of inputs and to select and output one of those inputs. Multiplexers select one of the inputs according to the value of a received control signal. For example, the nth input may be selected if the value represented by the received control signal is equal to n. A multiplexer may also include a decoder that is configured to receive a coded control signal and to decode the control signal into a decoded control signal having a 1 in the position corresponding to the input that is to be selected and 0 elsewhere. Accordingly, one of the input signals is selected and then output by the multiplexer.

Multiplexers typically contain multiple cells, the number of which is equal to the number of inputs that the multiplexer is configured to receive. Each cell of a multiplexer-and in certain cases, other supporting logic such as latches-is also configured to receive a clock signal that synchronizes the operation of the multiplexer with other parts of the circuit in high-speed applications. Accordingly, each of the cells of the multiplexer and supporting logic are configured to process corresponding input and control signals upon receiving an asserted clock signal. Though only one input is selected at a time (i.e., only one cell of the multiplexer is active at a time), the clock signal is typically provided to all the cells of the multiplexer as well as to corresponding latches and supporting logic.

Regardless of whether cells/logic are active during a clock cycle, the cells/logic present impedance to the clock signal in the form of capacitance. When voltage is applied to a part of a circuit having capacitance, power equal to the product of the capacitance and the voltage squared is required. Because capacitance values in integrated circuits have been steadily increasing as the sizes of the devices and the distances between the wires in the integrated circuits have been decreasing, power losses due to capacitance have been increasing. Each of the cells of a multiplexer and any latches and other logic contribute to an increase in the value of the overall capacitance in the circuit. Power is consumed when a clock signal is asserted to a cell and supporting logic regardless of whether the cell is active.

It would therefore be desirable to provide systems and methods to reduce the power consumption associated with the capacitance in multiplexers and similar circuits.

SUMMARY OF THE INVENTION

One or more of the problems outlined above may be solved by the various embodiments of the invention. Broadly speaking, the invention includes systems and methods for reducing the power consumption associated with the sections of a multiplexer circuit that are inactive when the timing signal is asserted.

One embodiment comprises a multiplexer including a plurality of dynamic input selection circuits and control circuitry which is coupled to the input selection circuits and configured to select one of the input selection circuits to provide a corresponding input at an output of the multiplexer. A clock signal is selectively provided to a first subset of the input selection circuits that includes the selected one of the input selection circuits. The clock signal is selectively inhibited to a second subset of the input selection circuits that does not include the selected one of the input selection circuits. In one embodiment, the clock signal is provided separately to an upper half and a lower half of the multiplexer. The clock signal for each half is AND'ed with either the most significant bit of the encoded select signal or the inverse of this bit, so that the clok signal is only provided to the active half of the multiplexer.

Another embodiment comprises a method including determining whether one or more portions of a multiplexer are not selected by a multiplexer control signal and inhibiting activity in these portions of the multiplexer when it is determined that they are not selected by the multiplexer control signal. In one embodiment, determining whether the portions of the multiplexer are active or not is based on examination of a control signal. For example, if a most significant bit of a select signal is 0, one of the lower half of inputs is selected, so a clock signal can be inhibited to the upper half of the multiplexer. If the most significant bit of the select signal is 1, one of the upper half of the inputs is selected, so the clock signal can be inhibited to the lower half of the multiplexer.

Numerous additional embodiments are also possible.

The various embodiments of the present invention may provide a number of advantages over the prior art. For example, with respect to the embodiment described above, power consumption related to the capacitance of a multiplexer circuit can be significantly reduced by selectively sending a timing signal only to portions of a circuit that contain active logic at a given clock cycle. Certain inactive portions of the circuit do not receive the timing signal and therefore do not consume power associated with the capacitance and the timing signals Similar advantages may be provided in other embodiments.

BRIEF DESCRIPTION OF THE DRAWINGS

Other objects and advantages of the invention may become apparent upon reading the following detailed description and upon reference to the accompanying drawings.

Figure 1:
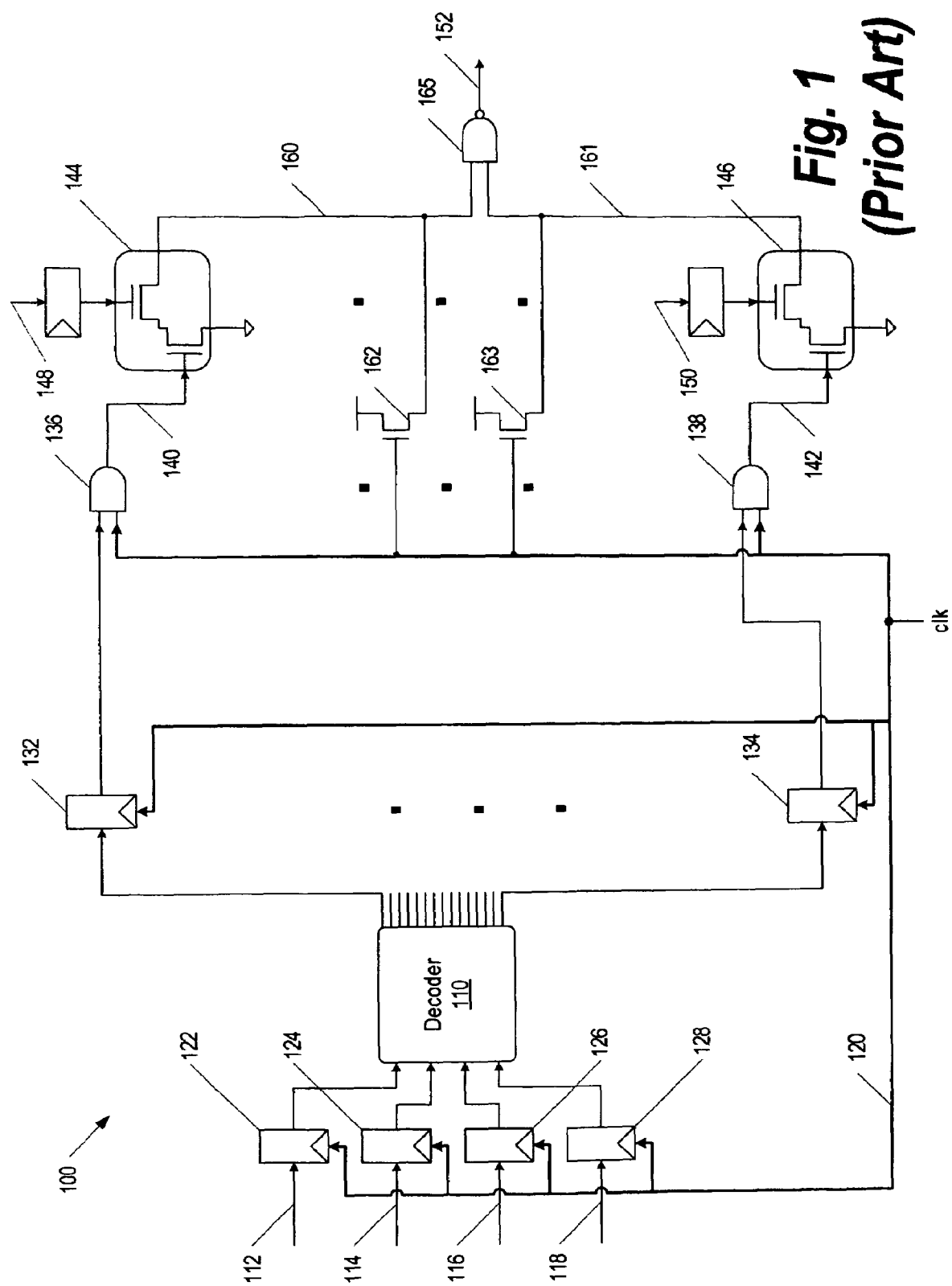
FIG. 1 is a circuit diagram illustrating a multiplexer and supporting logic configured to select one of multiple inputs in accordance with the prior art.

While the invention is subject to various modifications and alternative forms, specific embodiments thereof are shown by way of example in the drawings and the accompanying detailed description. It should be understood, however, that the drawings and detailed description are not intended to limit the invention to the particular embodiment which is described. This disclosure is instead intended to cover all modifications, equivalents and alternatives falling within the scope of the present invention as defined by the appended claims.

DETAILED DESCRIPTION OF EMBODIMENTS

One or more embodiments of the invention are described below. It should be noted that these and any other embodiments described below are exemplary and are intended to be illustrative of the invention rather than limiting.

Broadly speaking, the invention includes systems and methods for reducing the power consumption associated with the sections of a multiplexer circuit that are inactive when a timing signal is asserted.

While the invention is widely applicable to different types of systems, it is impossible to include all of the possible embodiments and contexts of the invention in this disclosure. The present disclosure therefore focuses on a few exemplary embodiments. It should be noted that these embodiments are intended to be illustrative rather than limiting. Upon reading this disclosure, many alternative embodiments of the present invention will be apparent to persons of ordinary skill in the art. All these alternative embodiments are within the scope of the appended claims.

One embodiment comprises a multiplexer comprising a dynamic circuit that separately provides a clock signal to an upper half and a lower half of the device. The multiplexer may, for example, be a 16-way multiplexer that receives data on 16 different input lines and provides the data from a single one of the input lines on an output line of the multiplexer. That particular one of the input lines that is selected to have the corresponding data provided on the output line is determined by a control signal (a select signal) that is input to the multiplexer. This control signal may, for example, be a four-bit signal, the value of which indicates the particular input line that is selected.

As indicated above, the multiplexer in this embodiment has an upper half and a lower half. The lower half handles input lines 0–7, while the upper half handles input lines 8–15 (where the lines are numbered 0–15.) In this embodiment, a control signal of "0000" selects input line 0, "0001" selects input line 1, and so on. Thus, the input lines of the lower half of the multiplexer are selected by control signals 0000–0111. The input lines of the upper half of the multiplexer are selected by control signals 1000–1111. It can be seen that, for the input lines in the lower half of the multiplexer, the first bit of the control signal is always 0. Conversely, for the input lines in the upper half of the multiplexer, the first bit of the control signal is always 1.

The multiplexer therefore uses the first bit of the control signal in this embodiment to selectively inactivate whichever of the two halves is not selected by the control signal. If the first bit of the control signal is 0, the upper half of the multiplexer is not selected, and can therefore be inactivated. If the first bit of the control signal is 1, the lower half of the multiplexer is not selected, and to this portion of the multiplexer can be inactivated. In one embodiment, the half of the multiplexer that is not selected can be inactivated by providing a selectively inhibited clock signal to each half of the multiplexer. Whichever half of the multiplexer is not selected can be inactivated by inhibiting the clock signal that is provided to the components of this portion of the multiplexer. This can be accomplished, for example, by AND'ing the clock signal to the upper half with the first bit of the control signal and AND'ing the clock signal to the lower half with the inverse of the first bit of the control signal. By inhibiting one of these clock signals, the power losses than would otherwise be caused by applying the clock signal to capacitive components in the corresponding half of the multiplexer can be avoided.

Referring to FIG. 1, a circuit diagram illustrating a multiplexer and supporting logic configured to select one of multiple inputs in accordance with the prior art is shown. System 100 is configured to receive inputs from input latches 148–150 and to select and output one of these inputs to be provided through output lines 160 and 161. Cells 144–146 are configured to select one of the inputs according to decoded control signals 140–142, which are received from AND gates 136–138. An input is selected if the decoded control signal from the corresponding one of decoded control input latches 132–134 is asserted (i.e., is equal to 1).

The example shown in FIG. 1 is assumed to be a 16-way multiplexer. Consequently, for each of the 16 ways, there is a corresponding input selection circuit. In the embodiment of FIG. 1, each input selection circuit includes a decoded control input latch (e.g., 132,) AND gate (e.g., 136,) cell (e.g., 144) and input latch (e.g., 148.) Only two sets of these input selection circuits are explicitly depicted in the figure for the sake of clarity.

Control signals are received in an encoded form through inputs 112, 114, 116, and 118, which are four parallel bit lines. The encoded control signal represents a binary number indicating which of the 16 input signals is to be selected. For example, a coded control signal of 0101 on the encoded control signal inputs indicates that the input signal 5 (binary 0101) is to be selected, assuming that the input signals—and corresponding cells and decoded signals—are numbered 0 through 15. Prior to sending the control signals to decoder 110, the control signals are latched in this embodiment by encoded control input latches 122, 124, 126, and 128. The signals are latched to prevent signal fluctuations and timing issues that may arise in high-speed applications. The latching operation may be timed using a clock signal received on line 120.

Decoder 110 is configured to receive the four control signals and to decode them into a 16-bit wide "one-hot" signal. In other words, one of the 16 bits is hot or high (1,) while all the others are low (0.) Consequently, one of the one-bit signals provided to decoded control input latches 132–134 is asserted, and the remaining decoded signals are not asserted.

The decoded control signals are latched using decoded control input latches 132–134, which are clocked using the clock signal on line 120. The outputs of decoded control input latches 132–134 are provided to AND gates 136–138. Each of the AND gates is configured to perform an AND operation on the corresponding decoded control signal and the clock signal on line 120 to generate a clock signal at the output of the AND gate only if the decoded control signal is asserted.

Cells 144–146 are configured to receive the clock signal output from AND gates 136–138. Of course, only the one of the cells corresponding to the asserted control signal will receive the clock signal at a given time. The clock signal is applied to the gate of a transistor within the cell so that, when the clock signal is asserted, the transistor is switched on. When the clock signal is not asserted, the transistor is switched off. Current can flow through the transistor, however, only if the other transistor in the cell is also switched on. This will be the case when the data signal in the corresponding one of input latches 148–150 (which is applied to the gate of the transistor) is a 1.

The two common output lines (160 and 161) from the cells are precharged to Vdd by a pair of precharge transistors 162 and 163. These transistors are switched on by the application of the clock signal to their gates. After each line is precharged, one of the lines will be pulled low if both transistors in the selected cell are switched on. Thus, because both output lines are normally high, the output of NAND gate 165 is normally low. If one of the output lines is pulled low (when the data bit in the selected input latch is high,) the output (152) of NAND gate 165 will go high. In this manner, the selected data input will be passed through to the output of the multiplexer (the output of NAND gate 165.)

In the prior art multiplexer of FIG. 1, the clock signal on line 120 is sent to latches 132–134 and to AND gates 136–138, regardless of whether these components are active. In a typical multiplexer configured to select and output only one of its multiple inputs, only one portion of the multiplexer—the cell and supporting logic corresponding to that cell—is active at any given time. Because of the capacitance associated with the latches, the AND gates, and the wiring leading to these devices, power is consumed every time the clock signal is asserted to these components, regardless of whether the particular portion of the circuit is active during that clock cycle. This power is equal to the capacitance times the square of the voltage.

Figure 2:
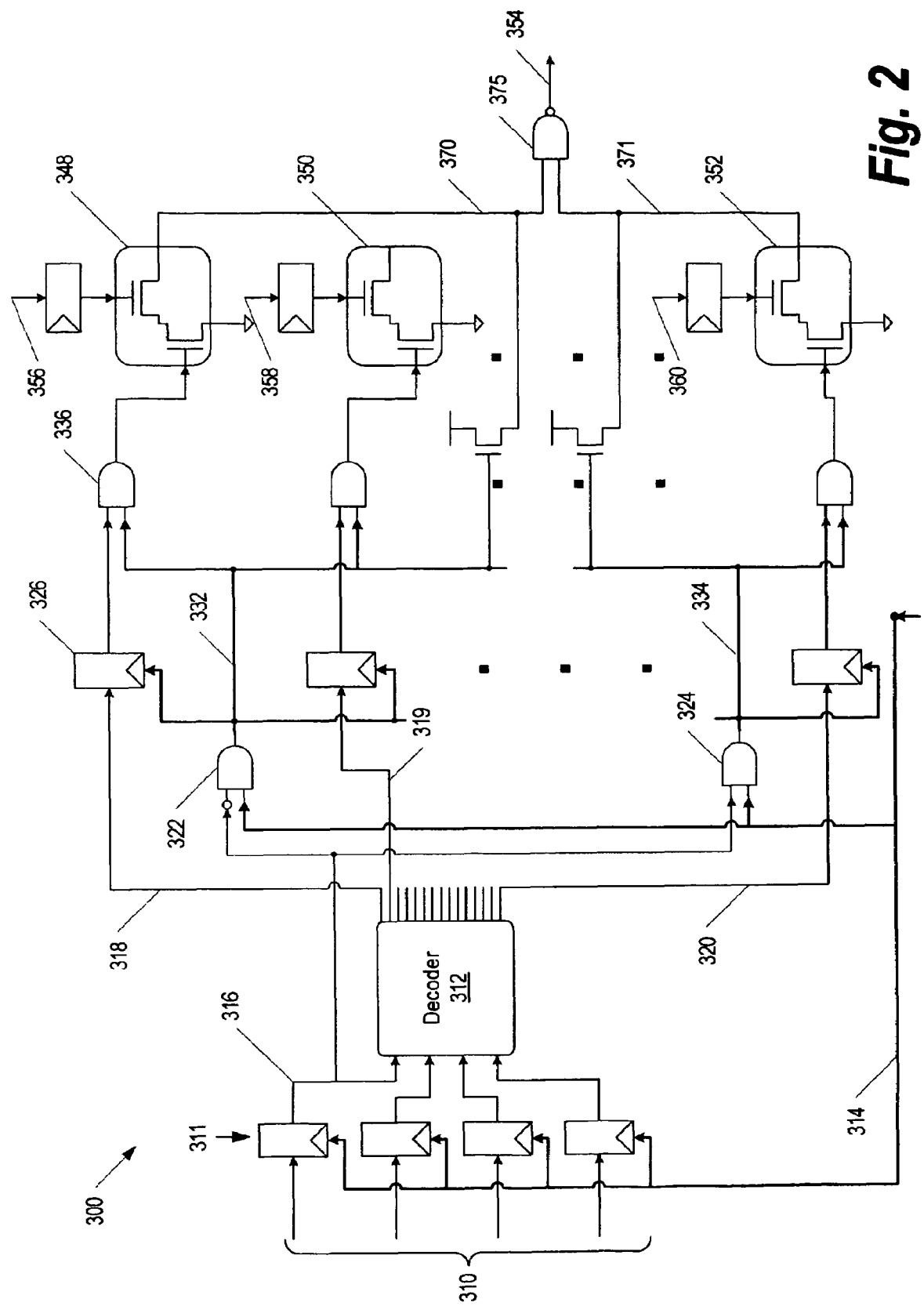
FIG. 2 is a circuit diagram illustrating a system for selectively sending a clock signal to one of two sections of a multiplexer in accordance with one embodiment.

Referring to FIG. 2, a circuit diagram illustrating a system for selectively sending a clock signal to one of two sections of a multiplexer in accordance with one embodiment is shown. This embodiment comprises a 16-way multiplexer. Only three of the input selection circuits are explicitly depicted for purposes of clarity.

System 300 is configured to receive control signals on lines 310 and to select signals on one of input lines 356–360 according to the values of those control signals for output through line 354. The control signals on lines 310 represent a four-bit binary number whose value indicates which one of the input signals is selected. For example, if the received binary number is 0110 (6), the seventh input signal is selected and output-assuming that the input signals are numbered 0–15. The decoded control signal is a one-hot binary number having a 1 in the position corresponding to the value represented by received control signals on lines 310 and 0's elsewhere. Prior to being provided to decoder 312, the control signals are clocked into corresponding latches using the clock signal on line 314 to avoid signal fluctuations.

Each of the decoded signals is sent to a corresponding cell and/or supporting logic of the multiplexer. For example, the first decoded signal is sent on line 318 to corresponding cell 348 and/or supporting logic, the second decoded signal is sent on line 319 to corresponding cell 350 and/or supporting logic, and the last decoded signal is sent on line 320 to corresponding cell 352 and/or supporting logic. The respective cells and supporting logic are configured to process the decoded control signals upon receiving a corresponding timing signal. For example, decoded control signal latch 326 is configured to receive the decoded control signal on line 318 and to store this signal only upon receiving a corresponding clock signal.

The timing signal that clocks the encoded control signals into latches 311 is received on line 314. The clock signal on line 314 is not provided directly to all of the cells and supporting logic in the multiplexer, however. This clock signal is selectively sent either only to the upper half of the circuit or only to the lower half of the circuit. This is accomplished by providing a single bit (the most significant bit) of the encoded control signal on line 316 to AND gates 322 and 324, along with the clock signal. The bit of the encoded control signal is inverted before being provided to AND gate 322. When the clock signal is AND'ed with the control bit, the clock signal is passed through one of the AND gates, but not through the other.

Accordingly, the clock signal provided on line 332, which is used as the timing signal for devices in the upper half of the circuit, is available when the bit of the encoded control signal on line 316 is 0. On the other hand, the clock signal is not available on line 332 when the bit of the encoded control signal on line 316 is 1. Conversely, the clock signal provided on line 334, which is used as the timing signal for devices in the lower half of the circuit, is available when the bit of the encoded control signal on line 316 is 1, but is not available when the bit of the encoded control signal is 0.

Thus, when the control bit is 0, hence one of input lines 0–7 is selected, the clock signal is made available to the cells and supporting logic for these input lines, but not for the cells and supporting logic of input lines 8–15. On the other hand, when the control bit is 1 and one of input lines 8–15 is selected, the clock signal is made available to the cells and supporting logic for these input lines, but not for the cells and supporting logic of input lines 0–7.

The advantage of inhibiting the clock signal to the side of the multiplexer that does not contain the currently selected input line is that, because the clock signal is not applied to the latches, gates and wires of this half of the multiplexer, none of the corresponding power is expended. Thus, rather than using an amount of power equal to the capacitance times the square of the voltage, only approximately half of this power is used.

It should be noted that, for those ones of the input selection circuits that are not selected, the decoded control input that is received by the AND gate (e.g.,336) is 0, so the output of the AND gate will be 0, regardless of whether a clock signal is applied to the other input of the gate or not. As a result, inhibiting the clock signal to the AND gate does not affect the output of the respective input selection circuit (i.e., one of the transistors of the cell will be switched off and the circuit will not discharge the output line.) Inhibiting the clock signal only serves to prevent power from being dissipated when the clock signal is applied to the gates and latches of the input selection circuit.

As for the one of the input selection circuits that is selected, the operation of the circuit is as described above in regard to FIG. 1. that is, the clock signal is applied to the gate of a transistor within the cell so that, when the clock signal is asserted, the transistor is switched on. When the clock signal is not asserted, the transistor is switched off. Current flows through the transistor when the other transistor in the cell is also switched on, which will be the case when the data signal in the corresponding input latch is a 1.

The two common output lines (370 and 371) from the cells are precharged to Vdd by precharge transistors 372 and 373, which are switched on by the application of the respective clock signals to their gates. It should be noted that the output line which is not associated with the selected input selection circuit will not be discharged, so there is no need to precharge this line. It is therefore possible to control this transistor with the potentially inhibited clock signal. After the line associated with the selected input selection circuit is precharged, the line will be pulled low if both transistors in the selected cell are switched on, thereby coupling the line to ground. The output line is coupled to NAND gate 375, which effectively inverts the signal on the line, so that the output of the NAND gate follows the data on the selected input.

It should be noted that various alternative configurations can be used in alternative embodiments of the multiplexer. For instance, rather than using two common output lines that are fed into a NAND gate, the output of each input selection circuit could be inverted and provided to an OR gate. Alternative configurations for other parts of the system may be used as well.

Figure 3:
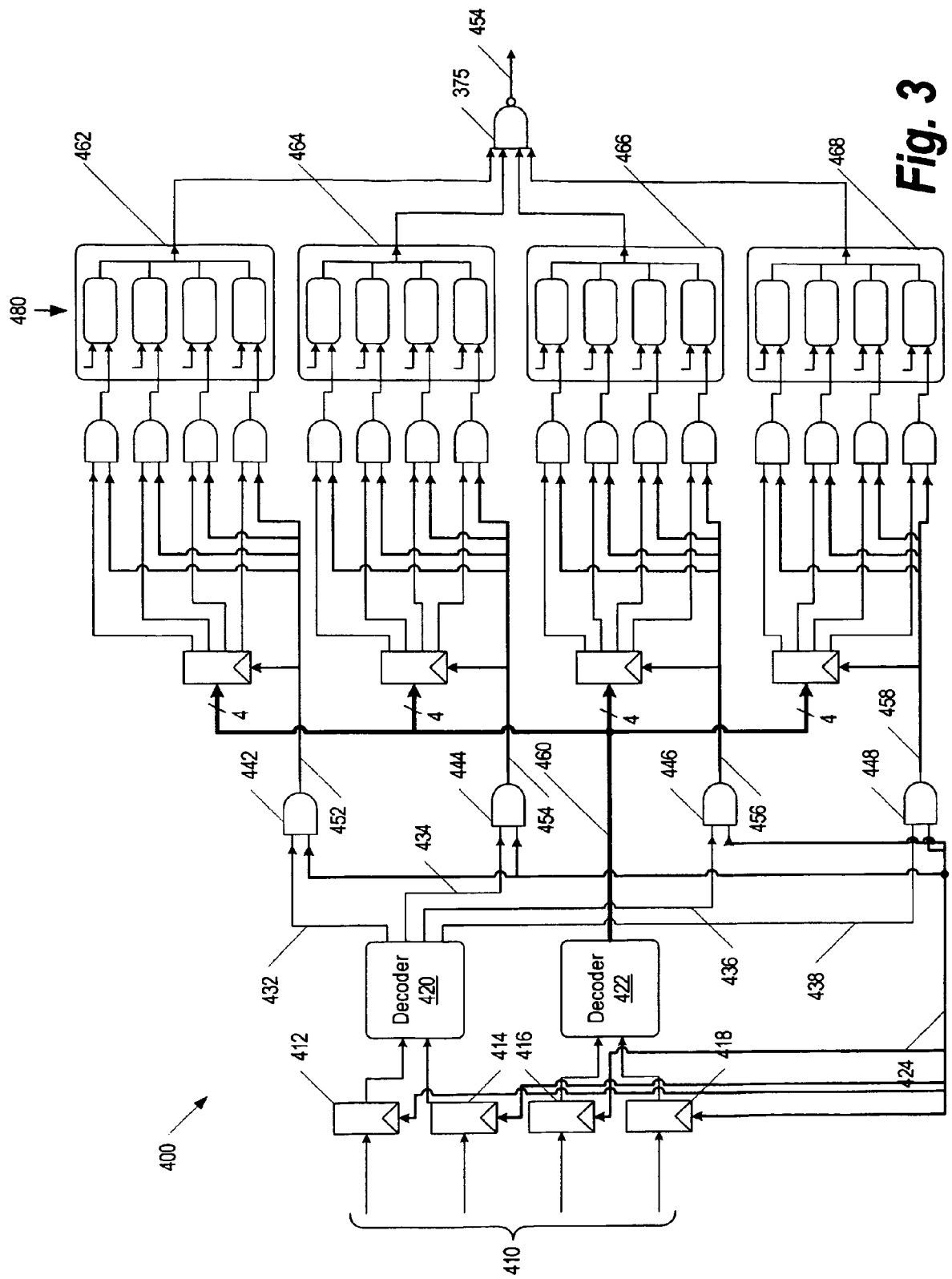
FIG. 3 is a circuit diagram illustrating a system for selectively sending a clock signal to one of four multiplexers in accordance with one embodiment.

Referring to FIG. 3, a circuit diagram illustrating a system for selectively sending a clock signal to one of four multiplexers in accordance with one embodiment is shown. System 400 is configured to receive encoded control signals on lines 410 and to select one of the 16 input signals to multiplexers 462, 464, 466, and 468 (there are four inputs to each) for output through output line 472 according to the values of those control signals.

The encoded control signals on lines 410 represent a binary number whose value indicates which one of the input signals to select. For example, if the received binary number is 1010 (10), the eleventh input signal is selected and output-assuming that the input signals are numbered 0–15. Prior to being sent to decoders 420 and 422, the encoded control signals on lines 410 may be clocked into latches 412, 414, 416, and 418 by clock signal 424 to avoid signal fluctuations.

Decoder 420 is configured to receive the top two (the two most significant bits) of the encoded control signals on line 410 and to output decoded control signals on lines 432, 434, 436, and 438. Decoder 422 is configured to receive the bottom two (the two least significant bits) of the encoded control signals on lines 410 and to output decoded control signals on line 460. The decoded control signals on lines 432, 434, 436, and 438 represent a one-hot binary number having a 1 in the position corresponding to the value represented by the two most significant bits of the signals on lines 410. For example, if the received signals represent the binary number 10, the decoded signal will have a 1 in the third position and 0's elsewhere (assuming the positions are numbered 0–3.) Similarly, decoded control signals on line 460 represent a one-hot binary number having a 1 in the position corresponding to the value represented by the two least significant bits of the control signals on line 410.

The decoded signals on lines 432, 434, 436, and 438 are sent to AND gates 442, 444, 446, and 448, respectively, together with the clock signal on line 424. Outputs 452, 454, 456, and 458 of the AND gates are clock signals for each of the four sections of circuit 400, respectively. Only one of the four clock signals is available at a time. Which one is available depends on the value of the control signals on line 410. The clock signals are then provided (if available) to the latches and logic gates in the corresponding potions of the multiplexer. As a result, the power consumption associated with the capacitance of the wires and components can be reduced to approximately one fourth of the corresponding power in a comparable conventional system.

Decoded signals on line 460 are sent to each of the four sections of multiplexer 400 to indicate which of the four inputs from within a section is to be selected. In one embodiment, the decoded signals on line 460 are in a one-hot format, so only one of the four signals is asserted, and the others are 0's. Accordingly, an input signal is selected if a clock signal is made available to the section corresponding to the input signal and if the one of the four decoded signals on line 460 corresponding to the input is asserted.

It should be noted that cells 480 within the different sections of multiplexer 400 are configured in the same manner as shown in FIG. 2. Thus, when the data in the selected input latch is a 1 and the clock signal goes high, the output line (which was previously precharged) is pulled low. When the output line is pulled low, the low signal is combined with three high signals from the other sections of the multiplexer, and the signal at the output 472 of NAND gate 470 is high.

Figure 4:
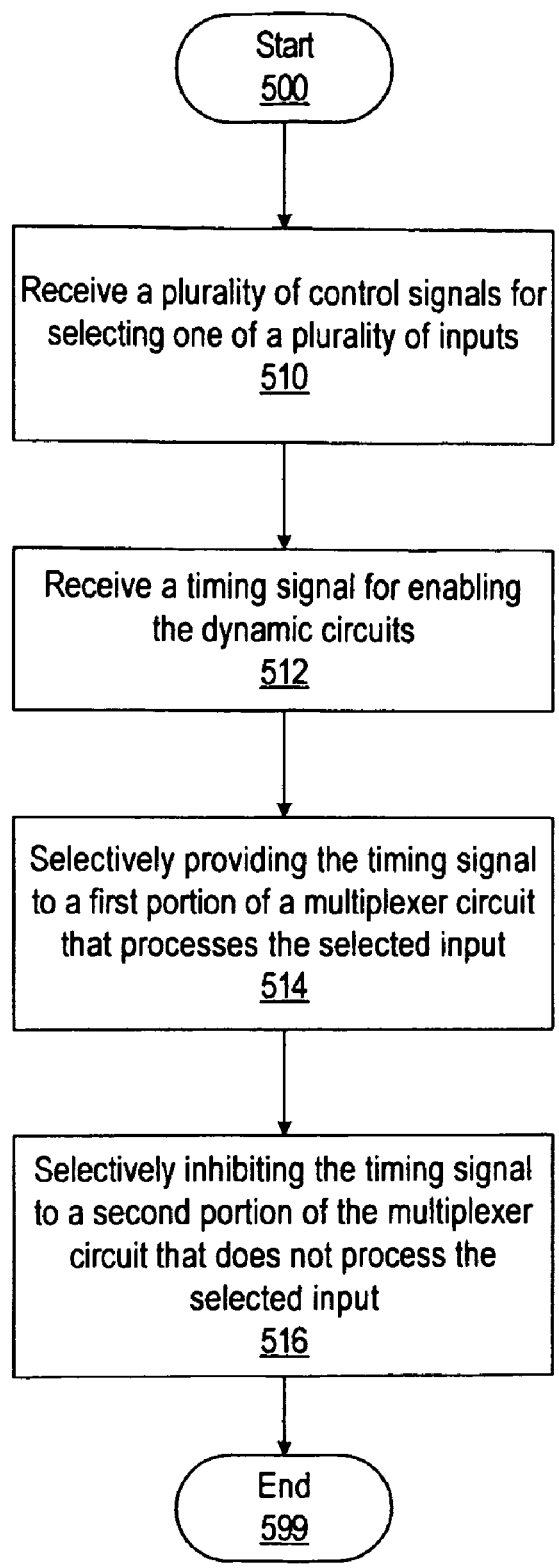
FIG. 4 is a flowchart illustrating a method for selectively sending a timing signal to a subset of a plurality of processing units in accordance with one embodiment.

Referring to FIG. 4, a flowchart illustrating a method for selectively sending a timing signal to a selected portion of a multiplexer in accordance with one embodiment is shown. Processing begins at 500 whereupon, at block 510, a plurality of control signals is received. The control signals are for selecting one of a plurality of inputs to be provided at the output of the multiplexer.

At block 512, a timing signal is received. In one embodiment, this timing signal comprises a clock signal that is provided to the components of the multiplexer to enable them to operate. For example, the clock signal is used to clock control signals into latches within the multiplexer, and to switch transistors on and off to generate a data signal at the output of the multiplexer.

At block 514, the timing signal is selectively provided to a portion of the multiplexer circuitry that corresponds to the selected input. This allows the data received at the input to be generated at the output of the multiplexer in essentially the same way as a conventional multiplexer. In one embodiment, the selected portion of the multiplexer circuitry corresponds to either an upper half or a lower half of the possible inputs. In another embodiment, the selected portion may comprise a quarter or some other portion of the multiplexer circuitry.

At block 516, the timing signal is selectively inhibited to a portion of the multiplexer circuitry that does not process the selected input. Since only the circuitry that processes the selected input needs to be operable, inhibiting the clock signal to the remainder of the circuitry does not adversely affect the performance of the multiplexer. By eliminating the application of the clock signal to capacitive circuit components, however, the amount of power used by the circuit is reduced.

Figure 5:
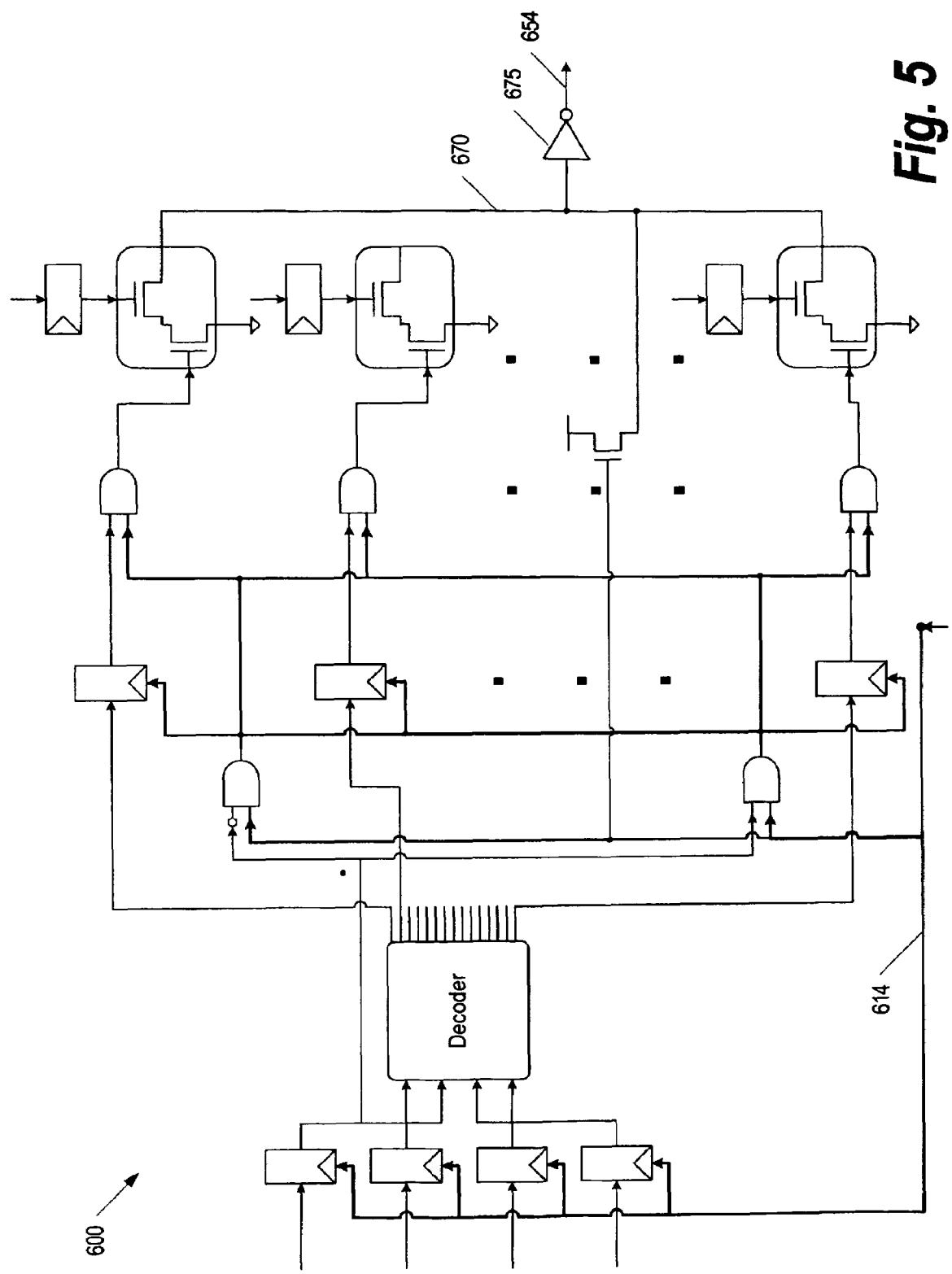
FIG. 5 is a circuit diagram illustrating a system for selectively sending a clock signal to one of two sections of a multiplexer in accordance with an alternative embodiment.

Referring to FIG. 5, a circuit diagram illustrating a system for selectively sending a clock signal to one of two sections of a multiplexer in accordance with an alternative embodiment is shown. This embodiment comprises a 16-way multiplexer, similar to the embodiment of FIG. 2, and is presented as an example of some of the alternative configurations that may be used in the various embodiments. Only three of the input selection circuits are explicitly depicted in FIG. 5 for purposes of clarity.

The components of system 600 are the same as the corresponding components of system 300. The difference between the two circuits is the manner in which the signals at the output of the selected input selection circuit. In system 300, there are two common output lines, 370 and 371, each of which is coupled to half of the input selection circuits. The common output line that is not coupled to the selected input selection circuit is always high, and the other common output line is inverted with respect to the selected input data stream. These two signals are AND'ed to produce a signal that follows the selected input data stream.

In system 600, however, there is only a single common output line, 670. This common output line is coupled to the input of an inverter, 675. Because the common output line is pulled down by a high signal on the selected input data stream (i.e., it is the inverse of the selected input data stream,) the output of inverter 675 produced on line 654 is the same as the selected input data stream. It should be noted that system 600 also differs from system 300 in that there is only a single precharge transistor, and this precharge transistor is coupled to line 614, so that it is switched on and off by the clock signal on line 614.

Figure 6:
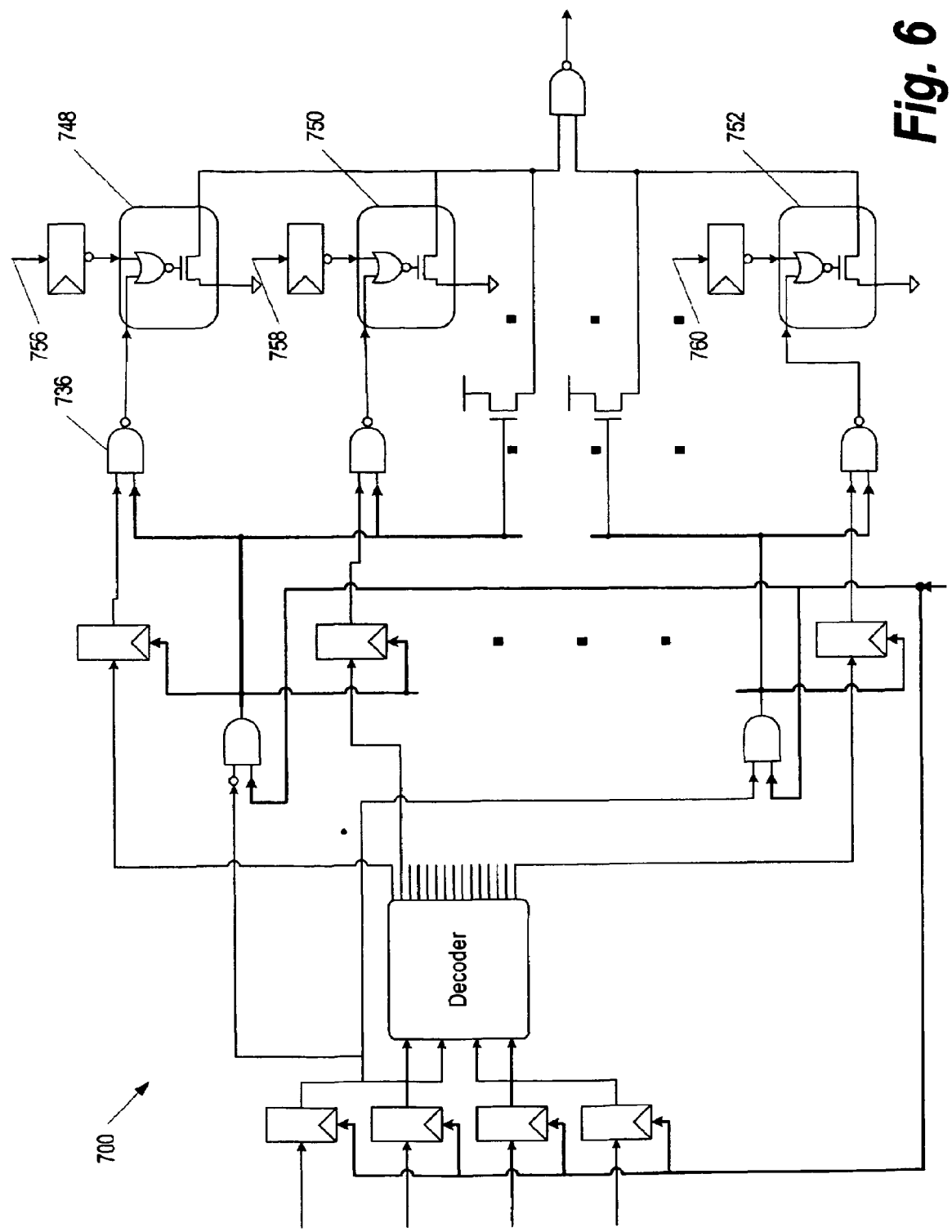
FIG. 6 is a circuit diagram illustrating a system for selectively sending a clock signal to one of two sections of a multiplexer in accordance with another alternative embodiment.

Referring to FIG. 6, a circuit diagram illustrating a system for selectively sending a clock signal to one of two sections of a multiplexer in accordance with another alternative embodiment is shown. This embodiment comprises another 16-way multiplexer, similar to the embodiments of FIGS. 2 and 5, and is presented as another example of the alternative configurations that may be used in the various embodiments. Only three of the input selection circuits are explicitly depicted in FIG. 6 for purposes of clarity.

The components of system 700 are the same as the corresponding components of system 300. The difference between the circuits is the configuration of the input selection circuits. In system 300, the clock signals on lines 332 and 334 and the decoded control signals are input to AND gates (e.g., 336.) In system 700, the clock signals and the decoded control signals are input to NAND gates (e.g., 736.) Further, the outputs of the data latches in system 700 (e.g., 756, 758, 760) are inverted before being provided to the input selection circuits. The data latch outputs of system 300 are not inverted. Finally, the cells themselves (e.g., 748, 750, 752) in system 700 comprise a NOR logic gate coupled to the gate of a transistor, rather than a pair of transistors, as in system 300 (see, e.g., 348, 350, 352.)

Those of skill in the art will understand that information and signals may be represented using any of a variety of different technologies and techniques. For example, data, instructions, commands, information, signals, bits, symbols, etc. that may be referenced throughout the above description may be represented by voltages, currents, electromagnetic waves, magnetic fields or particles, and the like, or any combination thereof.

Those of skill will further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Those of skill in the art may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with general purpose processors, digital signal processors (DSPs), application specific integrated circuits (ASICs), field programmable gate arrays (FPGAs) or other programmable logic devices, discrete gates or transistor logic, discrete hardware components, or any combination thereof designed to perform the functions described herein. A general purpose processor may be any conventional processor, controller, microcontroller, state machine or the like. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

While the present invention has been described with reference to particular embodiments, it should be understood that the embodiments are illustrative and that the scope of the invention is not limited to these embodiments. Many variations, modifications, additions and improvements to the embodiments described above are possible. It is contemplated that these variations, modifications, additions and improvements fall within the scope of the invention as detailed within the following claims.

What is claimed is:

1. A multiplexer comprising:
    a plurality of dynamic input selection circuits; and
    control circuitry coupled to the input selection circuits and configured to select one of the input selection circuits to provide a corresponding input at an output of the multiplexer;
    wherein a clock signal is selectively provided to a first subset of the input selection circuits that includes the selected one of the input selection circuits; and
    wherein the clock signal is selectively inhibited to a second subset of the input selection circuits that does not include the selected one of the input selection circuits
    further comprising a plurality of AND gates, wherein each of the AND gates receives the clock signal on a first input and a control signal on a second input, wherein the AND gate is configured to selectively provide the clock signal at an output when the received control signal is asserted,
    wherein the control signal for a first one of the AND gates comprises a most significant bit of an encoded select signal that is received by the multiplexer and wherein the control signal for a second one of the AND gates comprises an inverse of the most significant bit of the encoded select signal that is received by the multiplexer.

2. A multiplexer comprising:

a plurality of dynamic input selection circuits; and control circuitry coupled to the input selection circuits and configured to select one of the input selection circuits to provide a corresponding input at an output of the multiplexer;

wherein a clock signal is selectively provided to a first subset of the input selection circuits that includes the selected one of the input selection circuits; and wherein the clock signal is selectively inhibited to a second subset of the input selection circuits that does not include the selected one of the input selection circuits, further comprising a plurality of latches coupled to the decoder, wherein each latch is configured to store receive to store a portion of the decoded select signal and wherein one or more of the latches correspond to the first subset of the input selection circuits and one or more of the latches correspond to the second subset of the input selection circuits.

3. A multiplexer comprising:

a plurality of dynamic input selection circuits; and control circuitry coupled to the input selection circuits and configured to select one of the input selection circuits to provide a corresponding input at an output of the multiplexer;

wherein a clock signal is selectively provided to a first subset of the input selection circuits that includes the selected one of the input selection circuits; and wherein the clock signal is selectively inhibited to a second subset of the input selection circuits that does not include the selected one of the input selection circuits, wherein each input selection circuit comprises a pair of transistors coupled between a common output line and ground, wherein a first one of the transistors is switched on and off by the clock signal and a second one of the transistors is switched on and off by a data bit corresponding to the input selection circuit.

4. The multiplexer of claim 3, further comprising an input data latch coupled to the second transistor and configured to store the data bit corresponding to the input selection circuit.

5. The multiplexer of claim 3, further comprising an AND gate configured to receive the clock signal on a first input and a control signal on a second input, wherein the AND gate is configured to selectively provide the clock signal to the first transistor.

6. The multiplexer of claim 5, further comprising a control input latch coupled to the AND gate, wherein the control input latch is configured to store the control signal and to provide the control signal to the second input of the AND gate.

7. The multiplexer of claim 6, wherein the control input latch is clocked by the clock signal that is provided to the subset in which the input selection circuit is included.

8. The multiplexer of claim 1, wherein the first and second subsets comprise equal numbers of input selection circuits.

9. The multiplexer of claim 1, wherein the first subset contains a smaller number of input selection circuits than the second subset.

10. A multiplexer comprising:

a plurality of dynamic input selection circuits; and control circuitry coupled to the input selection circuits and configured to select one of the input selection circuits to provide a corresponding input at an output of the multiplexer;

wherein a clock signal is selectively provided to a first subset of the input selection circuits that includes the selected one of the input selection circuits; and wherein the clock signal is selectively inhibited to a second subset of the input selection circuits that does not include the selected one of the input selection circuits, wherein each input selection circuit comprises a transistor coupled between a common output line and ground, wherein the transistor is switched on and off by a NOR gate output, wherein inputs to the NOR gate include an inverted clock signal and an inverted data bit corresponding to the input selection circuit.

11. The multiplexer of claim 10, further comprising an input data latch coupled to the second transistor and configured to store a data bit corresponding to the input selection circuit, wherein the output of the input data latch is inverted to produce the inverted data bit.

12. The multiplexer of claim 10, further comprising a NAND gate configured to receive a clock signal on a first input and a control signal on a second input, wherein the AND gate is configured to selectively provide the inverted clock signal to the NOR gate.

13. The multiplexer of claim 12, further comprising a control input latch coupled to the NAND gate, wherein the control input latch is configured to store the control signal and to provide the control signal to the second input of the NAND gate.

14. The multiplexer of claim 13, wherein the control input latch is clocked by the clock signal that is provided to the subset in which the input selection circuit is included.

15. A method implemented in a multiplexer comprising:

determining whether one or more portions of a multiplexer are not selected by a multiplexer control signal; and inhibiting activity in the one or more portions of the multiplexer when it is determined that the one or more portions of the multiplexer are not selected by the multiplexer control signal, wherein the multiplexer comprises a first portion that receives a first half of a set of input lines and a second portion that receives a second half of the set of input lines, wherein the method further comprises inhibiting activity in the first portion when a first bit of the control signal is set to 0, and inhibiting activity in the second portion when the first bit of the control signal is set to 1.

16. The method of claim 15, wherein inhibiting activity in the one or more portions of the multiplexer comprises inhibiting a clock signal to the one or more portions of the multiplexer.

17. The method of claim 15, wherein determining whether the one or more portions of a multiplexer are not selected by the multiplexer control signal comprises determining whether corresponding bits of the control signal have values indicating that the one or more portions of a multiplexer are not selected.

18. The method of claim 15, further comprising AND'ing the first bit of the control signal with a first clock signal that is provided to the first portion and AND'ing the inverse of the first bit of the control signal with a second clock signal that is provided to the second portion.

* * * * *